United States Patent
Chao et al.

(10) Patent No.: US 6,517,996 B1
(45) Date of Patent: Feb. 11, 2003

(54) METHOD OF MANUFACTURING FULL-COLOR ORGANIC ELECTRO-LUMINESCENT DEVICE

(75) Inventors: Ching-Ian Chao, Hsinchu Hsien (TW); En-Chung Chang, Yunlin Hsien (TW); Chia-Fen Hsieh, Tainan (TW); Rung-Ywan Tsai, Taoyuan Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 159 days.

(21) Appl. No.: 09/715,527

(22) Filed: Nov. 17, 2000

(30) Foreign Application Priority Data

Aug. 7, 2000 (TW) .......................................... 89115831 A (51) Int. Cl.⁷ ................................................ H01J 9/227
(52) U.S. Cl. ........................ 430/321; 430/315; 430/319; 427/66
(58) Field of Search ................................. 430/321, 319, 430/315; 313/504; 445/24; 427/66, 68, 70

(56) References Cited

U.S. PATENT DOCUMENTS 5,294,869 A * 3/1994 Tang et al. .................. 313/504
6,384,529 B2 * 5/2002 Tang et al. .................. 313/506

* cited by examiner

Primary Examiner—John A. McPherson
(74) Attorney, Agent, or Firm—J.C. Patents (57) ABSTRACT

A method of manufacturing a full-color organic electro-luminescent device on an indium-tin-oxide glass substrate. A pattern is formed on the indium-tin-oxide glass substrate by the photolithography and the etching process. The indium-tin-oxide glass substrate is cleaned. An insulation pad is formed over the indium-tin-oxide glass substrate. A low shadow mask and a high shadow mask are sequentially formed over the insulation pad by conducting dry film photo-resist processes. A hole-transport layer is formed over the indium-tin-oxide glass substrate by conducting a vapor-depositing process. Three vapor-depositing processes are simultaneously conducted to form red, green and blue light-emitting layers on the hole-transport layer using the low shadow mask and the high shadow mask as a barrier. An electron-transport layer and a metal layer are serially formed over the light-emitting layers by conducting vapor-depositing processes.

26 Claims, 5 Drawing Sheets

METHOD OF MANUFACTURING FULL-COLOR ORGANIC ELECTRO-LUMINESCENT DEVICE

CROSS-REFERENCE TO RELATED APPLICATION

This application claims the priority benefit of Taiwan application serial no. 89115831, filed Aug. 7, 2000.

BACKGROUND OF THE INVENTION

1. Field of Invention

The present invention relates to a method of manufacturing a full-color organic electro-luminescent (OEL) device. More particularly, the present invention relates to a method of manufacturing a full-color organic electro-luminescent (OEL) device using a special designed process and equipment, in which the dry-film photo-resist as the shadow mask is made on the insulated pad and the deposition of RGB sub-pixels is carried out in the same time.

2. Description of Related Art

Investigation of on organic electro-luminescent material began in the 1960s and more than 30 years of research data has been accumulated right now. When the investigation of single crystal organic compound was first reported in 1963, a high voltage of around 400 volts had to be applied before luminescent occurs. Yet, the brightness level produced by the luminescent material is too weak to have any real-life application.

In 1987, Kodak in America reported some success in producing organic low-molecular-weight electro-luminescent device in Appl. Phys. Lett., Vol.51, p914(1987). In 1990, Cambridge University in England was similarly successful in utilizing the polymer material to produce electro-luminescent devices in Nature, Vol.347, p539 (1990). From these earlier researches, foundation for investigating actual application of electro-luminescent devices by governments, institutes and academies is laid.

Highly desirable properties of electro-luminescent material include self-illumination, wide viewing angle (up to 160°), rapid response, low driving voltage and full-color spectrum. Hence, electro-luminescent been highly regarded as the planar display techniques of the future. At present, the development of electro-luminescent devices has reached such a high degree of sophistication that electro-luminescent display can be out in the next generation of planar color displays. These planar luminescent devices can be used in high-quality, full-color planar displays such as miniature display panel, outdoor display panel, computer and television screens.

At present, research in electro-luminescent products is directed towards the investigation of device and material structure. Rapid development in low-molecular-weight electro-luminescent material has produced the first prototype full-color organic electro-luminescent display. However, some technical problems still prevent the use polymer material in full-color organic electro-luminescent devices. One major difficulty lies in the alignment of red-green-blue (R-G-B) sub-pixels in the spin-coating process.

Color display techniques using organic electro-luminescent material can be roughly divided into two sub-categories, namely, direct full-color display techniques and indirect full-color display techniques.

Literature of direct full-color display techniques includes:

1. A full-color electro-luminescent device structure having micro-cavities of various depths is developed in Cambridge (Adv. Mater., Vol.7, p541 (1996); Synth. Met., Vol. 76, p137(1996)), by Cimrova et. el (Appl. Phys. Lett., Vol. 69, p608 (1996)); in Bell Lab and Motorola (R.O.C patent no. 301,802, 318,284, 318, 966). However, the method of production is rather complicated. Furthermore, producing micro-cavities at different depth levels is a high-cost process.

2. A method of stacking organic electro-luminescent element capable of emitting blue light and organic electro-luminescent element capable of emitting red light on top of a substrate is developed jointly by Princeton and Southern California University (Appl. Phys. Lett., Vol.69, p2959 (1996)); R.O.C. patent no. 294,842). However, the method uses difficult fabrication techniques. Moreover, the metal electrodes between the light-emitting element blocks off a portion of the red and green light, thereby lowering the brightness level.

3. A method that uses X-Y addressing pattern for fabricating a full-color organic electro-luminescent device capable of different color pixels is developed by Kodak Co. of America (U.S. Pat. No. 5,294,869 and 5,294, 870). It utilizes the shift of metal mask to form R-G-B individual sub-pixels in the deposition process so that it is not good for the applications of higher resolution and larger substrate.

4. A method of fabricating full-color organic electro-luminescent device by photo bleaching is developed by professor Kido of Japan. The method uses light to damage the resonance structure of red-energy-gap material of the light-emitting layer so that energy gap of the material is increased, green-blue-red pixels are formed and pixels of different colors are fixed for full-color display.

Besides the aforementioned production methods, a method that utilizes an ink-jet printing technique instead of spin-coating to fabricate a polymer electro-luminescent device is developed by Yang Yang (Science, Vol.279, p 1135(1990)). The method can reduce the consumption of polymer material and can produce whatever display pattern and words. Size of ink drop can be as small as 30 $\mu$m. The method can be applied to produce a full-color display device. However, this method is new and many technical problems still exists. Problems such as the transportation of indium-tin oxide glass, the type of solvents to be used and the blocking of inkjet nozzle need to be addressed.

Literature of indirect full-color display techniques includes:

1. TDK Co. has developed a full-color organic electro-luminescent device that uses a color filter. First, a conventional method is used to fabricate a white light electro-luminescent component. Red, green and blue color filters are added to the white-light-emitting pixels so that the white light is converted into red, green and blue light respectively. Although this method is capable of producing a full-color display device from a white-light-emitting component, the filters greatly reduce light intensity of the device.

2. A full-color organic electro-luminescent device having a color conversion layer has been developed by Idemitsu Kosan. The device has a structure similar to a light-emitting device with filters. Although light conversion of the blue light can be used to produce a full-color display device, the process of forming separating column is complicated. Moreover, using a conversion layer for red, green and blue will lower light intensity of the device.

Apart from the previous methods, another direct full-color display technique similar to this invention is presented and compared as below.

Figure 1A:
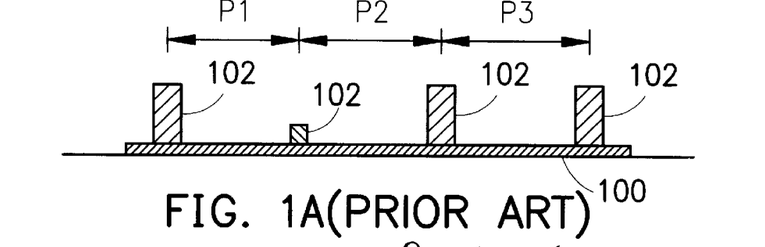
FIGS. 1A through 1E are schematic cross-sectional views showing the steps for producing a full-color organic electro-luminescent device according to a Kodak's patent.
Figure 1B:
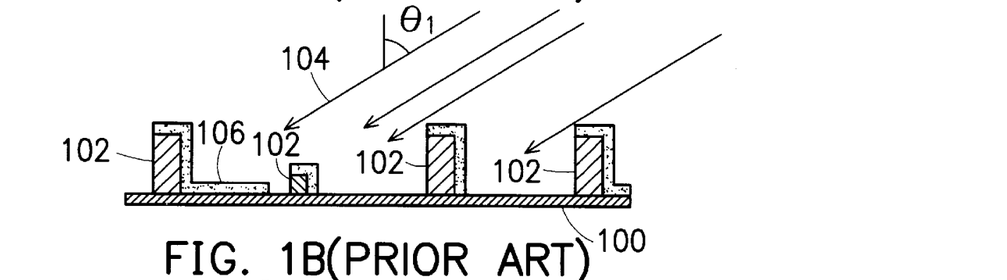
Figure 1C:
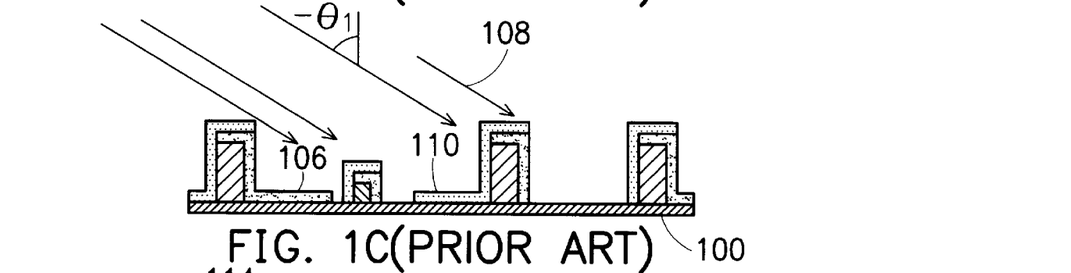
Figure 1D:
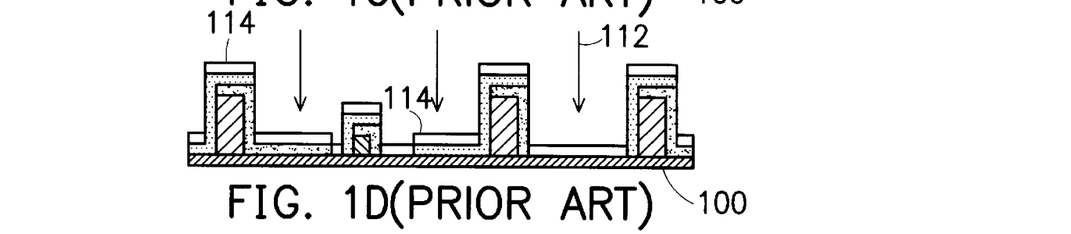
Figure 1E:
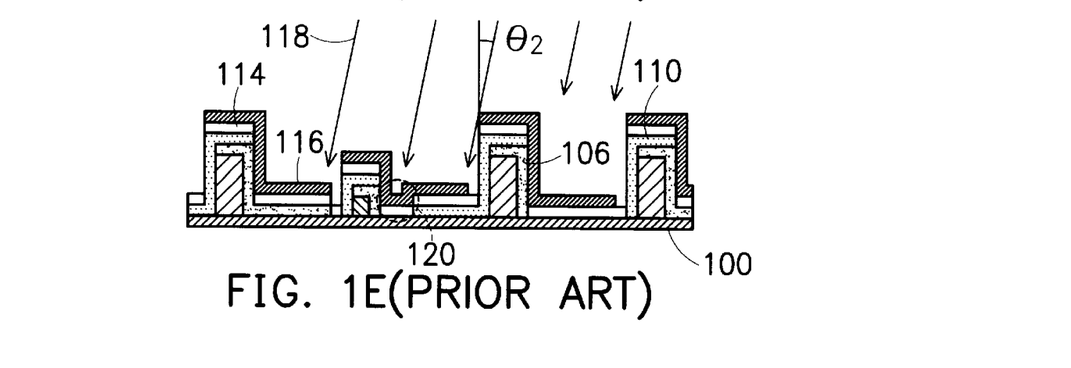

Kodak of America has introduced an X-Y address-patterning method for producing a full-color organic electro-luminescent device in U.S. Pat. No. 5,294,869. FIGS. 1A through 1E are schematic cross-sectional views showing the steps for producing a full-color organic electro-luminescent device according to a conventional X-Y addressing pattern. First, as shown in FIG. 1A, a vertical shadow mask is formed over an indium-tin-oxide glass substrate 100 by a wet photo-resist production or a dielectric film deposition method. As shown in FIG. 1B to FIG. 1D, three vapor deposition operations are carried out to deposit red, green and blue color materials. In the first vapor deposition operation 104 shown in FIG. 1B, a first type of material is deposited on the substrate 100 at an angle $\theta_1$ to form a sub-pixel 106. In the second vapor deposition operation 108 as shown in FIG. 1C, a second type of material is deposited on the substrate 100 at a negative angle $\theta$ to form a sub-pixel 110. In the third vapor deposition operation 112 shown in FIG. 1D, a third type of material is deposited on the substrate 100 vertically to form a sub-pixel 114. As shown in FIG. 1E, a metal layer 116 is formed by the fourth vapor deposition operation 118 at an angle $\theta_2$. Utilizing the vertical shadow mask 102, the interconnection between sub-pixels is prevented. Although this method is able to produce a full-color display device, in fact, a few problems remain. The problems include:

(I) The process of forming a vertical shadow mask: Since a wet photo-resist production or a dielectric film deposition method is used to form the shadow mask, thickness of the mask 102 can hardly rise above 20 μm. In addition, forming a mask having uniform thickness on a large-area substrate is difficult. If thickness of the mask layer is non-uniform, subsequent positioning and size of red, green and blue sub-pixels are all affected.

(II) Shadow effect: The design of most conventional evaporator for deposition organic electro-luminescent material requires the substrate to be fastened onto a rotary holder. When the deposition starts, the substrate rotates so that a uniform layer is formed. However, the substrate must be fixed in position in the shadow-mask process, so that a material beam can shine on the substrate at a fixed angle. Consequently, rotary deposition is not suitable for the shadow-mask process. Although any non-uniformity of the vapor-deposited layer on a substrate when the substrate doesn't rotate can be reduced by calibration, a non-rotating substrate renders every point on the substrate having a slightly different angle relative to a vaporizing source. This can lead to variations in position and size of red, green, blue sub-pixels on the substrate. This phenomenon is all the more serious when the substrate has a large surface area.

(III) Leakage current in the device: As shown in FIG. 1E, only a layer of organic film is deposited over the substrate at position 120 on the right side of some shadow mask layer. This thinner portion can result in considerable leakage current when a metal layer is subsequently deposited to serve as an electrode. This is also an area where short-circuiting is more likely to occur leading to device failure.

A conventional evaporator for vapor deposition has independent evaporation chambers. Indium-tin-oxide glass substrates are moved into different evaporation chamber by robotic hands to perform different vapor deposition processes. During the vapor deposition process, the indium-tin-oxide glass substrate must rotate continuously to form a uniformly coated film. Hence, a conventional evaporator is unsuitable for the shadow mask process. In addition, a convention evaporator operates on a unit-by-unit basis rather than a continuous production flow. Therefore, spatial utilization of the evaporation chamber is low. Furthermore, size of the evaporation chamber limits the ultimate size of the indium-tin-oxide glass substrate. To achieve higher stability in the production process, sophisticated robotic control system has to be deployed. This also adds to the production cost of an evaporator.

SUMMARY OF THE INVENTION

Accordingly, one object of the present invention is to provide a method of manufacturing a high-efficiency full-color organic electro-luminescent device with the direct full-color display technique.

A second object of this invention is to provide a method of manufacturing a full-color organic electro-luminescent device capable of self-positioning red, blue and green sub-pixels on a substrate concurrently so that the alignment steps in the traditional metal mask process are saved.

A third object of this invention is to provide a method of manufacturing a full-color organic electro-luminescent device that employs a unique insulation pad capable of preventing shadow effect that may lead to a leakage current in the device. Hence, production yield of the device is increased.

A fourth object of this invention is to provide a processing station design that facilitates the manufacturing of the full-color organic electro-luminescent device of this invention.

To achieve these and other advantages and in accordance with the purpose of the invention, as embodied and broadly described herein, the invention provides a method of manufacturing a full-color organic electro-luminescent device. An indium-tin-oxide glass substrate is provided. The indium-tin-oxide glass substrate is etched to form a desired pattern. The glass substrate is cleaned. An insulation pad is formed over the glass substrate by carrying out a photo-resist processing and a film-deposited operation. A patterned shadow mask is formed on the glass substrate by performing a dry film photo-resist processing. The shadow mask pattern can be subdivided into two types. One type of shadow mask has a thickness of about 1 μm to 10 μm, commonly referred to as a low shadow mask (LSM). Another type of shadow mask has a thickness of about 5 μm to 100 μm, commonly referred to as a high shadow mask (HSM). The indium-tin-oxide glass substrate is cleaned again. Hole-transport material such as N, N'-diphenyl-N,N'-(m-tolyl) benzidine (TPD) is deposited onto the indium-tin-oxide glass substrate in a vapor-depositing process to form a uniform layer having a thickness of about 30 nm to 100 nm. Preferably, the conducting material forms a layer having a thickness between 40 nm to 80 nm.

Blue light-emitting material used in the concurrent vapor-deposition process includes perylene. The blue light-emitting material is deposited vertically onto the indium-tin-oxide glass substrate in the vapor-deposition process to form a uniform layer between 10 nm to 40 nm. Preferably, the deposited blue material has a thickness between 15 nm to 30 nm. Red light-emitting material including nile red and green light-emitting material including quinacridone are preferably evaporated from each side at an suitable angle simultaneously. The concentrations of the red and the green light-emitting materials are controlled to within 0.1% to 10% (v/v) in volume ratio and preferably between 0.5% to 5%(v/v). After the vapor-deposition process, the blue sub-pixels are formed in the center of the pixels while the red and the green sub-pixels are positioned on each side of the blue sub-pixel. In the subsequent step, electron-transport material such as tris-(8-hydroxyquinoline) aluminum (Alq3) is deposited in a vapor-depositing process to form a uniform layer with a thickness of about 30 nm to 100 nm. Preferably, the thickness is between 40 nm to 80 nm.

Magnesium (Mg) and silver (Ag) are deposited with a tilted angle. The deposited metal functions as a negative electrode. The deposited magnesium layer has a thickness between 10 nm to 100 nm, preferably between 30 nm to 70 nm. The deposited silver layer has a thickness between 150 nm to 500 nm, preferably between 200 nm to 350 nm. With the indium-tin-oxide layer functioning as a positive electrode and the metal layer as a negative electrode, a functional full-color organic electro-luminescent device could be performed when a suitable operating voltage is applied.

This invention also provides a processing station for manufacturing the full-color organic electro-luminescent device.

In this invention, the shadow mask is formed by a dry film photo-resist processing. In addition, RGB sub-pixels are positioned individually by a slant-angle depositing process so that RGB sub-pixels can be produced in a single vapor-depositing operation. Compared with the conventional metal-mask-shift method, in which RGB sub-pixels are deposited in three depositing operations, the invention has fewer processing steps and does not require accurate mask alignment, precision shifting and mask cleaning. In brief, RGB positioning process of this invention is simple to operate and has a fast throughput, and hence suitable for mass production at a lower cost.

The manufacturing station for producing electro-luminescent device of this invention also employs an innovative design. Rather than rotating the indium-tin-oxide glass substrate while performing a vapor-depositing operation, the glass substrate is mounted on a cassette and carried by a conveyer belt to various vapor-depositing compartments for different-type depositing operations. Consequently, the manufacturing station is capable of continuous processing, thereby increasing overall spatial utilization. In addition, glass substrate having a relatively large surface area can still be vapor-deposited by the station. Since the glass substrate is moved by a conveyer belt system, robotic arm transport is unnecessary. Hence, cost of equipment is reduced and processing stability is also improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2:
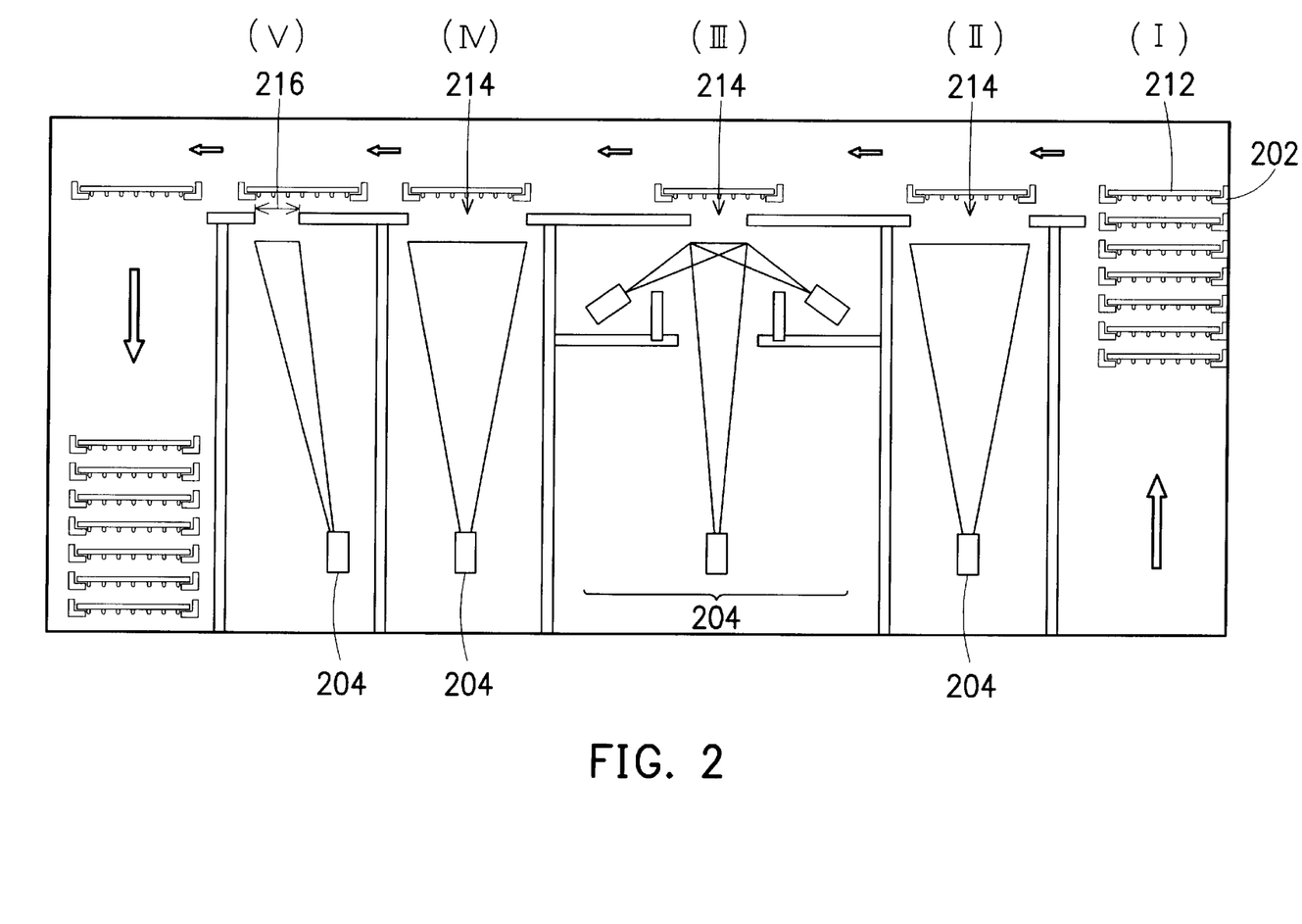
FIG. 2 is a schematic side view showing the layout of various components of a processing station for manufacturing a full-color organic electro-luminescent device of this invention.

FIG. 2 is a schematic side view showing a layout of components in the processing station. The station includes a conveyer belt 200(not shown in FIG. 2) for moving indium-tin-oxide glass substrates, cassettes 202 and a plurality of evaporation source packs 204. Each evaporation source pack 204 includes at least one evaporation source. These evaporation source packs are able to deposit a hole-transport layer, concurrent to deposit red, green and blue sub-pixels, then an electron-transport layer and a metal layer. After a patterned shadow mask is formed over the indium-tin-oxide glass substrate 212 by dry film photo-resist processing, the indium-tin-oxide glass substrate 212 is placed in a cassette 202 and put into area (I) of FIG. 2. The glass substrate 212 in the cassette 202 is carried by the moving conveyer belt 200 into area (II) where the evaporation source pack 204 targets the glass substrate 212 to form a hole-transport layer. The glass substrate 212 then moves on into area (III) where the evaporation source pack 204 targets the glass substrate 212 to form red, green and blue sub-pixels. The glass substrate 212 is moved to area (IV) where the evaporation source pack 204 targets the glass substrate 212 to form an electron-transport layer. Finally, the glass substrate 212 moves to area (V) where the evaporation source pack 204 targets the glass substrate 212 to form a metal layer. The evaporation sources in an evaporation source pack 204 are positioned next to each other. Each evaporation source pack 204 can carry out vapor-deposition operation independent of others. During the vapor-deposition process, the indium-tin-oxide glass substrate 212 remains stationary inside the cassette. Hence, no rotary motion is imparted on the glass substrate 212. As shown in FIG. 2, the glass substrate 212 in the cassette 202 is deposited each time on passing in front of a rectangular opening 214. Thickness of the vapor-deposited film depends on the parameters including deposition rate, width of the opening 216, moving speed, locations of the evaporation sources. These parameters are free to vary in each vapor-depositing chamber so that deposition operations can be optimized with identical processing period. Consequently, each evaporation source group can carry out a different glass substrate depositing operation concurrently. Uniformity of a deposited layer on the glass substrate 212 in the vertical direction (vertical to the paper, not shown) of the opening 214 depends on the positioning of the evaporation sources and the uniformity of deposition rate along the vertical direction. Uniformity of deposited layer can be improved by calibrating a group of evaporation sources. The advantages of the vapor-depositing station of this invention over a conventional vapor-depositing station are listed out in Table 1 for comparison. In Table 1, the symbol "O" represents "best", the symbols "Δ" represent "moderate" and the symbol "X" represents "worst".

TABLE 1

A comparison of the vapor-depositing station in the invention with a coventional vapor-depositing station

|  | Conventional vapor-depositing station | Vapor-depositing station according to the invention |
| --- | --- | --- |
| Suitability for shadow-mask process | X | O |
| Flexibility of processing adjustments | X | O |
| Suitability for depositing different-size substrate | Δ | O |
| Spatial Utilization | Δ | O |
| Stability | Δ | O |
| Cost of the Station | High | Low |

Compared with the indirect full-color methods such as TDK's white light with color filter, Idemitsu Kosan's and Kodak's blue light with color conversion medium and direct full-color method such as an stacked device, the full-color display technique used in this invention is a direct type, the full-color device fabricated according to this invention has a relatively higher emission efficiency and lower power consumption. Thus, the device is advantageous in portable electronic products such as mobile phone, personal data assistance (PDA) and digital camera (DC).

Figure 3:
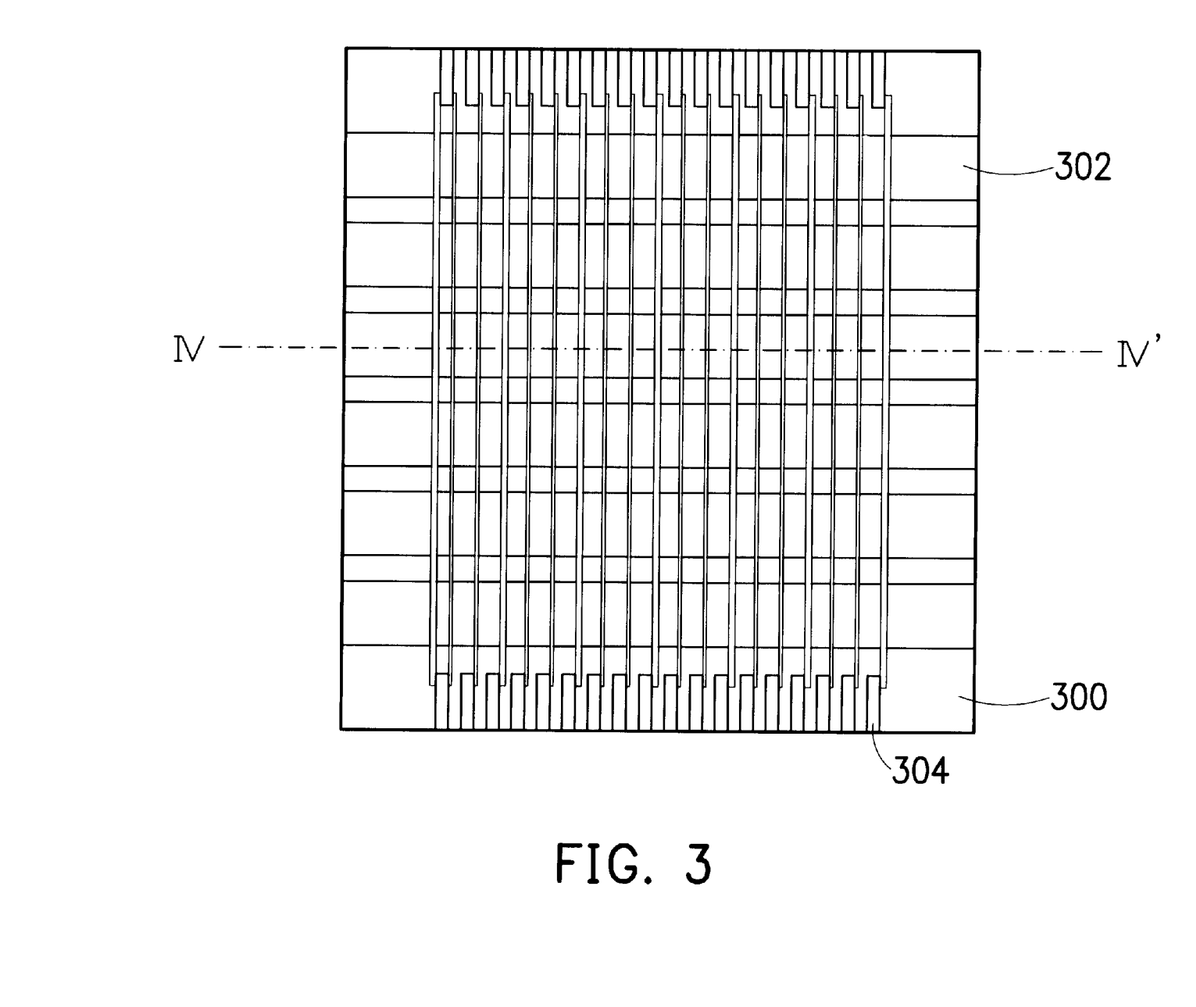
FIG. 3 is a schematic top view of a 6×6 pixel array passive driven display board according to one preferred embodiment of this invention.

Red, green and blue sub-pixels in the full-color organic electro-luminescent device of this invention are positioned on the substrate in the same vapor-depositing operation. In addition, an innovative dynamic manufacturing station having a continuous line of vapor-depositing compartments is adopted for producing devices. Therefore, the method and the manufacturing station of this invention can be used together for the production of passive matrix well as active matrix in a full-color organic electro-luminescent display panel. FIG. 3 is a schematic top view of a 6×6 passive matrix display according to one preferred embodiment of this invention. As shown in FIG. 3, the display board 300 can be made of glass or plastic. Area labeled 302 shows an indium-tin-oxide material pattern. Area labeled 304 shows the connecting leads on the indium-tin-oxide panel for connecting with external circuits.

Figure 4A:
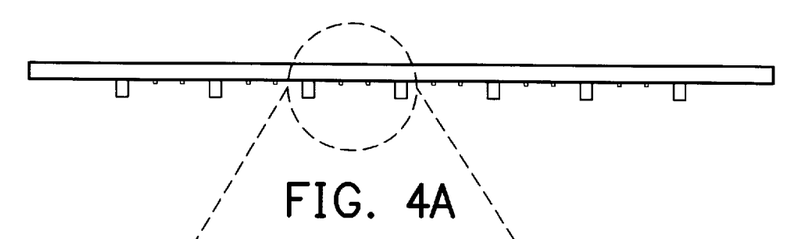
FIGS. 4A through 4G are schematic cross-sectional views showing the progression of steps for forming a full-color organic electro-luminescent device according to this invention.
Figure 4B:
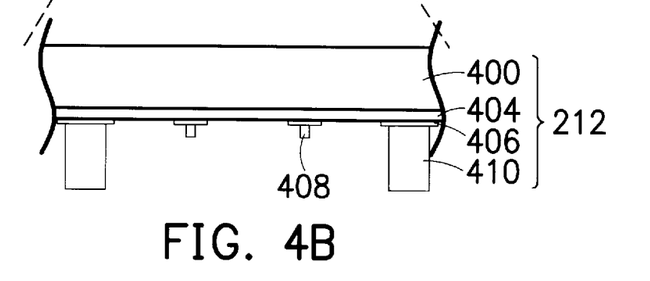

FIGS. 4A through 4G are schematic cross-sectional views showing the progression of steps for forming a full-color organic electro-luminescent device according to this invention. FIG. 4A is a cross-sectional view along line IV—IV' of FIG. 3. FIG. 4B is a magnified view of the central portion of the substrate shown in FIG. 4A to show a single pixel.

As shown in FIG. 4B, the substrate 400 can be made from glass or plastic. Traditional photolithography and etching process are carried out to form a desired indium-tin-oxide pattern 404. Insulation pads 406 are formed over the pattern 404 using photo-resist material and physic vapor depositing processes. The insulator pad 406, preferably having a thickness of between 5 nm to 200 nm, can be a silicon oxide layer or a silicon nitride layer. The insulation pad 206 serves two functions, including the prevention of any current leaks from any thinner section of the organic film layer and defining the size of light-emitting region so that pixel size is standardized. Finally, two dry film photo-resist processing operations are conducted to form two different types (having different height or thickness) of shadow masks over the insulation pads 206. The first type of shadow mask has a height (or thickness) between 1 $\mu$m to 10 $\mu$m, commonly referred to as a low shadow mask (LSM) 408. The second type of shadow mask has a height (or thickness) between 5 $\mu$m to 100 $\mu$m, commonly referred to as a high shadow mask (HSM) 410.

Figure 4C:
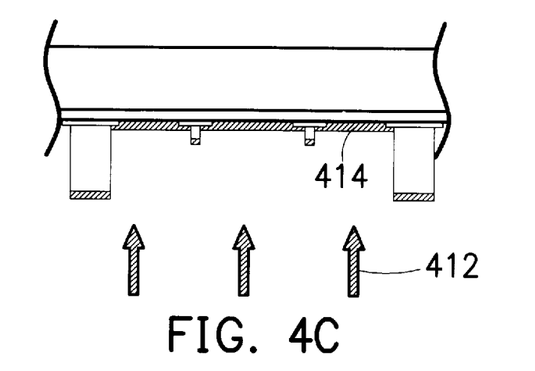

After the patterned shadow masks are formed over the indium-tin-oxide glass substrate 212 by dry film photo-resist processing, the indium-tin-oxide glass substrate 212 is placed inside a cassette 202 and put into area (I) of FIG. 2. The cassette 202 serves not only as a transportation carrier for the glass substrate 212, but serves also as mask preventing any vapor from depositing on electrodes near the edges of the substrate 212. As shown in FIG. 4C, vapor deposition of hole-transport material 412 on the surface of the indium-tin-oxide glass substrate 212 to form a hole-transport layer 414 is carried out in area (II) of FIG. 2. The glass substrate 212 in the cassette 202 is carried by a moving conveyer belt 200 into area (II). An evaporation source pack 204 targets the glass substrate 212 and deposits hole-transport material vertically on the substrate 212 to form the hole-transport layer 414. The rate of deposition of hole-transport material is around 1Å to 3Å per second.

Figure 4D:
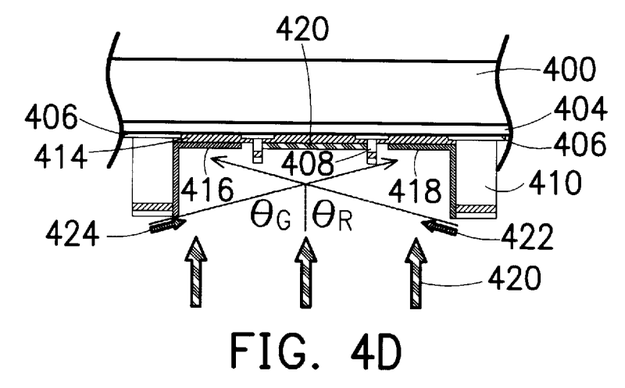

As shown in FIG. 4D, the high shadow mask 410 on the substrate 212 is capable of positioning red sub-pixels 416, green sub-pixels 418 and blue sub-pixels 420. Blue light-emitting material can be a hole-transport or an electron-transport material. Blue light-emitting material 420 is deposited vertically onto the surface of the indium-tin-oxide glass substrate 212. On the other hand, red light-emitting material 422 and green light-emitting material 424 are deposited at an angle with the surface of the glass substrate 212. The evaporators for the red and the green light-emitting material are mounted on each side of the evaporator for blue light-emitting material with the vapor beams at an angle $\theta_R$ and $\theta_G$ respectively. In general, the angles $\theta_R$ and $\theta_G$ are within the range from 45° to 80°. Utilizing the shadowing effect of the high shadow mask 410, vapor-depositing operations are carried out concurrently. Red and green light-emitting materials are deposited on the right and left side of a pixel position to form a red and a green sub-pixel. Blue light-emitting material is deposited in the middle of the pixel position to form a blue sub-pixel. The percentages of the red and the green light-emitting materials in the blue light-emitting materials are about 0.5% to 5% by volume ratio. Consequently, the film thickness in the co-deposition step is mainly controlled by blue light-emitting material. The deposition rate of blue light-emitting material is around 1 to 3 Å/s while the rate of deposition of red and green-energy-gap material is around 0.01 to 0.3 Å/s. The deposition of red, green and blue light-emitting materials is carried out in area (III) of FIG. 2. The indium-tin-oxide glass substrate 212 is transported by the conveyer belt 200 into area (III). Utilizing the shadowing effect of the high shadow mask 410, red, green and blue sub-pixels 416, 418 and 420 are concurrently formed on the pre-defined positions.

Figure 4E:
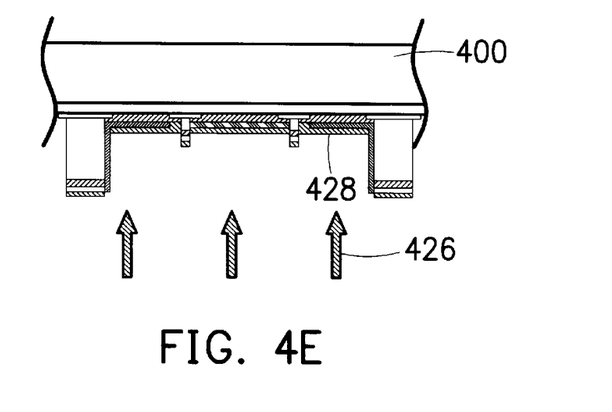

As shown in FIG. 2, the indium-tin-oxide glass substrate 212 is moved by the conveyer belt 200 to area (IV). An evaporation source pack 204 for electron-transport material targets the glass substrate 212 to form an electron-transport layer 428. As shown in FIG. 4E, an electron-transport material 426 front lands on the surface of the indium-tin-oxide glass substrate 212 to form the electron-transport layer 428. Deposition rate of the electron-transport material is around 1Å to 3Å per second.

Figure 4F:
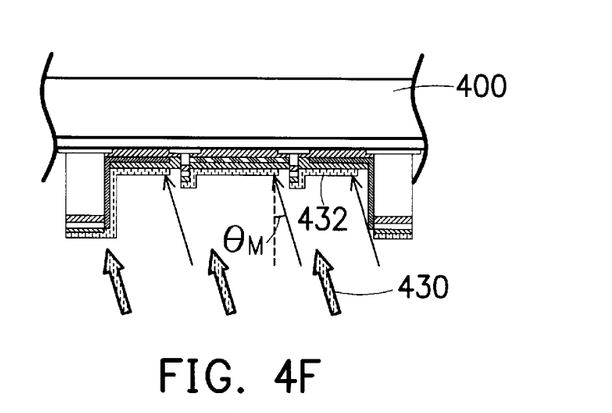
Figure 4G:
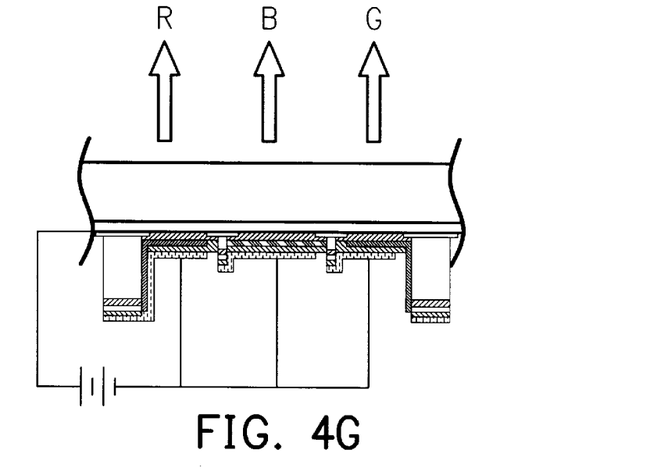

As shown in FIG. 2, the indium-tin-oxide glass substrate 212 is moved by the conveyer belt 200 into area (V). An evaporation source pack 204 for metal material targets the glass substrate at a suitable angle to form a metal electrode 432. As shown in FIG. 4F, metal material 430 is deposited onto the surface of the glass substrate 212 at an angle $\theta_m$ from the vertical to form the metal electrode 432. The angle $\theta_m$ ranges from 5° to 60°. The materials as metal electrode could be calcium, magnesium, lithium, aluminum, silver and so on. Due to the shadowing effect of the high shadow mask 410 and the low shadow mask 408, the metal electrodes 432 on the substrate 212 will be automatically isolated from each other. Hence, a full-color device containing a plurality of pixels with each pixel comprising of red and green sub-pixels on each side of a blue sub-pixel is formed.

During the vapor-depositing process as shown in FIG. 2, the indium-tin-oxide glass substrate 212 remains stationary inside the cassette 202. Hence, no rotary motion is imparted on the glass substrate 212. As shown in FIG. 2, the glass substrate 212 in the cassette 202 is deposited each time on passing in front of a rectangular opening 214. Thickness of the vapor-deposited film depends on parameters including deposition rate, width of the opening 216, moving speed, locations of the evaporation sources. These parameters are free to vary in each vapor-depositing chamber to optimize each depositing operation so that each operation is complete within identical period. Consequently, each evaporation source group can carry out a different glass substrate depositing operation concurrently. Uniformity of a deposited layer on the glass substrate 212 in the vertical direction (vertical to the paper, not shown) of the opening 214 depends on the positioning of the evaporation sources 204 and the uniformity of deposition rate along the vertical direction. Uniformity of deposited layer can be improved by calibrating a group of evaporation sources.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a full-color organic electro-luminescent device, comprising the steps of:
   patterning an indium-tin-oxide glass substrate;
   cleaning the indium-tin-oxide glass substrate;
   forming an insulation pad over the indium-tin-oxide glass substrate;
   forming a low shadow mask over the insulation pad by a first dry film photo-resist process;
   forming a high shadow mask over the insulation pad by conducting a second dry film photo-resist process;
   forming a hole-transport layer over the indium-tin-oxide glass substrate by conducting a vapor-depositing process;
   conducting three vapor-depositing processes simultaneously to form red, green and blue light-emitting materials on the hole-transport layer in the same step using the low shadow mask and the high shadow mask as a barrier;
   forming an electron-transport layer over the red, the green and the blue light-emitting materials by conducting a vapor-depositing process; and
   forming a metal layer over the electron-transport material by conducting a vapor-depositing process.

2. The method of claim 1, wherein material forming the insulation pad is selected from the group consisting of silicon nitride and silicon oxide.

3. The method of claim 1, wherein the low shadow mask has a thickness between 1 $\mu$m to 10 $\mu$m.

4. The method of claim 1, wherein the high shadow mask has a thickness between 5 $\mu$m to 100 $\mu$m.

5. The method of claim 1, wherein material forming the hole-transport layer includes N,N'-diphenyl-N,N'-(m-tolyl) benzidine.

6. The method of claim 1, wherein the hole-transport layer has a thickness between 40 nm to 80 nm.

7. The method of claim 1, wherein the blue vapor-depositing material used in the simultaneous vapor-depositing process includes perylene.

8. The method of claim 1, wherein the thickness of the red, the green and the blue light-emitting materials is between 15 nm to 30 nm.

9. The method of claim 1, wherein the step of performing a simultaneous vapor-depositing process includes providing a blue-light-emitting-material evaporation source, a red-light-emitting-material evaporation source and a green-light-emitting-material evaporation source.

10. The method of claim 9, wherein the evaporation sources for the red and the green sub-pixels are positioned on each side of the blue material evaporation source.

11. The method of claim 1 wherein the red and the green light-emitting materials in the blue light-emitting material are controlled at a percentage between 0.5% to 5% by volume ratio.

12. The method of claim 9, wherein the step of forming the blue sub-pixels includes aiming a beam of blue material from the blue evaporation source front at the surface of the indium-tin-oxide glass substrate in a vapor-depositing process.

13. The method of claim 9, wherein the step of forming the red sub-pixels and the green sub-pixels includes aiming a beam of red material from the red evaporation source and a beam of green material from the green evaporation source simultaneously at the indium-tin-oxide glass substrate surface both tilted at an identical angle from the vertical but on opposite side.

14. The method of claiming wherein the angle of tilt from the vertical is between 45° to 80°.

15. The method of claim 1, wherein material forming the red sub-pixels includes nile red and material forming the green sub-pixels includes quinacridone.

16. The method of claim 1, wherein material forming the electron-transport layer includes tris-(8-hydroxyquinoline) aluminum.

17. The method of claim 1, wherein the electron-transport layer has a thickness between 40 nm to 80 nm.

18. The method of claim 1, wherein the evaporation source for depositing metal layer is set at an angle of tilt from a vertical to the indium-tin-oxide glass substrate surface.

19. The method of claim 18, wherein the angle of tilt is between 5° to 60°.

20. The method of claim 1, wherein material forming the metal layer is selected from the group consisting of calcium, magnesium, lithium, aluminum and silver.

21. The method of claim 1, wherein the metal includes a layer of magnesium and a layer of silver.

22. The method of claim 21, wherein the magnesium layer has a thickness between 30 nm to 70 nm.

23. The method of claim 21, wherein the silver layer has a thickness between 200 nm to 350 nm.

24. The method of claim 1, wherein the metal layer is a negative electrode.

25. The method of claim 1, wherein the indium-tin-oxide glass substrate is a positive electrode.

26. The method of claim 1, wherein the insulation pad has a thickness between 5 $\mu$m to 200 $\mu$m.

\* \* \* \* \*